United States Patent [19]

Ito et al.

[11] 4,152,682

[45] May 1, 1979

[54] FINE TUNING MECHANISM IN A TUNER

[75] Inventors: Katsuo Ito; Kazunori Yoshimura, both of Kanazawa, Japan

[73] Assignee: Murata Manufacturing Co., Ltd., Nagaokakyo, Japan

[21] Appl. No.: 824,949

[22] Filed: Aug. 15, 1977

[30] Foreign Application Priority Data

May 18, 1977 [JP] Japan ............................. 52-64148[U]
May 18, 1977 [JP] Japan ............................. 52-64149[U]

[51] Int. Cl.² .............................................. H03J 5/30
[52] U.S. Cl. ..................................... 334/51; 74/10.85; 74/384; 74/432; 334/57
[58] Field of Search ....................... 334/51, 57, 58, 74; 74/10.85, 384, 397, 432

[56] References Cited

U.S. PATENT DOCUMENTS

4,041,422  8/1977  Noji et al. ........................... 334/51 X

*Primary Examiner*—Paul L. Gensler
*Attorney, Agent, or Firm*—Wenderoth, Lind & Ponack

[57] ABSTRACT

A tuner for use in a telecommunication receiver having a rotary drum carrying a plurality of oscillation coils and a fine tuning member for each coil supported for movement inside of the coil for fine tuning and having a geared head, and a main shaft on which the rotary drum is rigidly mounted, and a fine tuning mechanism which has a hollow shaft coaxially mounted on the main shaft for movement between projected and retracted positions and having a drive gear mounted thereon and a transmission gear assembly for transmitting the rotational force of the hollow shaft to the geared head of any one of the fine tuning members. The transmission gear assembly is supported by a support plate assembly.

10 Claims, 9 Drawing Figures

FINE TUNING MECHANISM IN A TUNER

BACKGROUND OF THE INVENTION

The present invention generally relates to a tuner for use in a telecommunication receiver, such as a television receiver or radio receiver. More particularly, the present invention relates to a tuner of a type having a fine tuning mechanism.

Most tuners currently employed in television receivers have a fine tuning mechanism for fine adjustment of the television receiver circuitry to an operating frequency within a selected television channel. In general, these tuners comprise a plurality of oscillation coils, mounted peripherally on a turret drum rotatable through any one of a plurality of detent positions corresponding in number to the number of the oscillation coils, and a fine tuning member for each oscillation coil movably or adjustably supported inside the oscillation coil for varying the inductance of the selected oscillation coil in relation to the local oscillator frequency.

In these tuners, various linkage mechanisms have been used for effecting selection of any one of the television channels and subsequent fine tuning after one of the television channels has been selected. Two of the prior art linkage mechanisms, which appear to be pertinent to the present invention, are illustrated in FIGS. 1 and 2, respectively, of the accompanying drawings and will now be described with reference thereto.

Figures 1, 2, 3, 4:
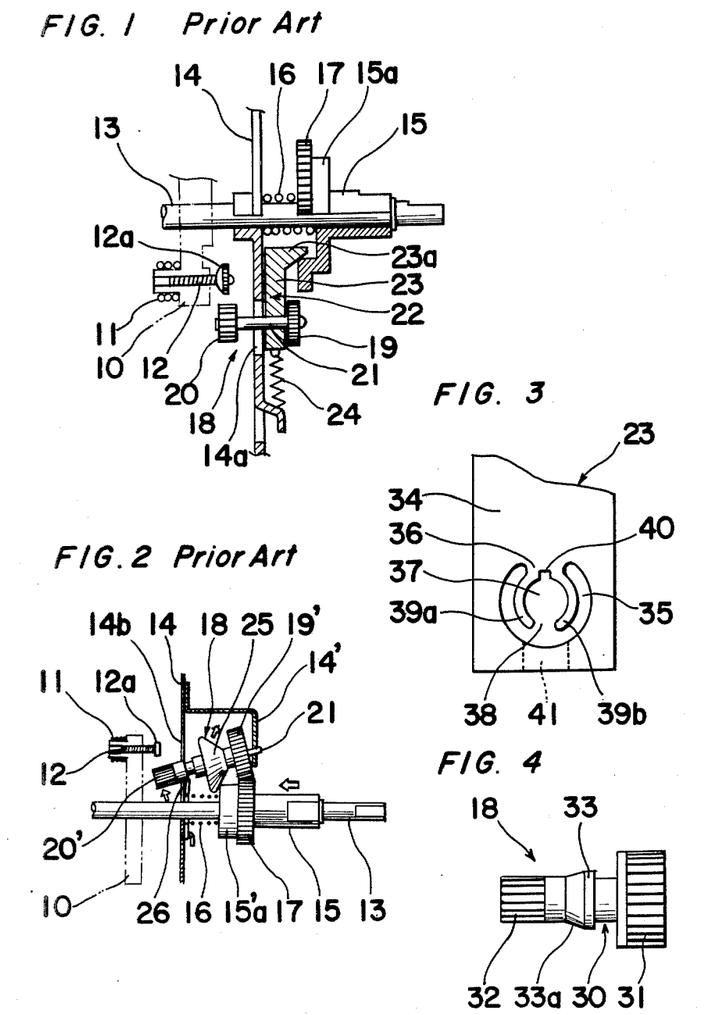
FIGS. 1 and 2 are longitudinal sectional views showing two types of prior art tuner, reference to which has already been made.
FIG. 3 is a front elevational view of an essential portion of a support plate member which can be used in the tuner of the construction shown in FIG. 1 according to one preferred embodiment of the present invention.
FIG. 4 is a side elevational view of a transmission gear assembly.

Referring first to FIG. 1, the prior art tuner comprises a turret drum, a portion of which is shown at 10, having a plurality of oscillation coils, one of which is shown at 11, which coils are peripherally mounted on said turret drum 10 in equally spaced relation to each other and also to the longitudinal axis of the drum 10. A fine tuning member 12 in the form of a bolt member having its head portion shaped to provide a gear 12a is employed for each oscillatory coil 11 and is supported by the turret drum 10 for adjustable or threading movement inside of the coil 11 for varying the inductance of the coil 11 as is well known to those skilled in the art.

The turret drum 10 is rigidly mounted on a channel selection shaft 13 rotatably extending outwardly through a wall member 14 forming a part of, for example, a chassis, it being understood that, incident to rotation of the channel selection shaft 13, the turret drum 10 can be stepwisely rotated to any one of a plurality of detent positions defined by any known detent mechanism (not shown) and being substantially equal in number to the number of the coils 11.

A fine tuning mechanism comprises a fine tuning shaft 15 coaxially mounted on the channel selection shaft 13 on one side of the wall member 14 remote from the turret drum 10 for rotary movement about and independently of the channel selection shaft 13 and also for axial sliding movement between projected and retracted positions in a direction parallel to the shaft 13. This fine tuning shaft 15 is normally biased to the projected position by a spring element 16, for example, a compression spring mounted on the shaft 13 and positioned between the wall member 14 and the fine tuning shaft 15.

At one end of the fine tuning shaft 15 adjacent the wall member 14, the shaft 15 has a radially outwardly enlarged portion 15a thereon, the outer periphery of said enlarged portion 15a having a drive gear 17 thereon.

The fine tuning mechanism further comprises a transmission gear assembly generally indicated at 18 and composed of a pair of gears 19 and 20 rigidly mounted on a common spindle 21 which loosely extends through a slot 14a in the wall member 14 and which is rotatably carried by a support member 22. The support member 22 is shown as being in the form of a substantially rectangular flat plate 23 having a lateral projection 23a of substantially right-angled triangular shape on one end protruding in a direction away from the wall member 14 and into the hollow interior of the enlarged portion 15a of the fine tuning shaft 15. The support plate 23 is supported by the wall member 14 by means of any known guide (not shown) for movement between engaged and disengaged positions in a direction perpendicular to the longitudinal axis of the channel selection shaft 13 and is normally biased to the disengaged position by the action of a spring element 24, for example, a tension spring connected between the other end of the support plate 23 and a portion of the wall member 14. Because the support plate 23 is biased to the disengaged position, the lateral projection 23a protruding into the hollow of the enlarged portion 15a of the fine tuning shaft 15 has the sloped surface constantly engaged with the inner peripheral edge of the enlarged portion 15a as shown and the gears 19 and 20, carried by the support plate 23 on the common spindle 21 rotatably inserted through said support plate 23 are respectively disengaged from the gears 17 and 12a.

With the tuner shown in FIG. 1 being constructed as hereinabove described, the fine tuning can be carried out by first axially pushing the shaft 15 towards the retracted position against the force of the spring element 16 and then rotating the shaft 15 in either direction about the longitudinal axis of the shaft 13 while the shaft 15 is still maintained in the retracted position. In particular, since the fine tuning shaft 15 is axially pushed from the projected position towards the retracted position against the force of the spring element 16, the inner peripheral edge of the enlarged portion 15a slides along the sloped surface of the lateral projection 23a, thereby causing the support plate 23 to shift from the disengaged position towards the engaged position against the force of the spring element 24. Upon completion of the movement of the shaft 15 to the retracted position against the force of the spring element 16, the support plate 23 is held in the engaged position with the gears 19 and 20 respectively engaged with the gears 17 and 12a. Therefore, it is clear that rotation of the shaft 15 while the latter is still held in the retracted position will be transmitted to the fine tuning member 12 through the transmission gear assembly 18.

Referring now to FIG. 2, while some components of the tuner shown in FIG. 2 which are structurally and functionally similar to those employed in the tuner shown in FIG. 1 are designated by like reference numerals used in FIG. 1, there is a substantial difference in construction between the tuner shown in FIG. 1 and that shown in FIG. 2, particularly in the transmission gear assembly 18 and the support for such assembly 18.

In FIG. 2, the end of the fine tuning shaft 15 adjacent the wall member 14 is radially outwardly enlarged to define a boss 15'a and the gear 17 is rigidly mounted on or integrally formed with the shaft 15 at the junction between the shaft 15 and the boss 15'a. The transmission gear assembly includes the spindle 21, having one end pivotally and rotatably supported by an overhanging wall member 14' secured to the wall member 14, and the other end loosely extending through a slot 14b in the wall member 14 and having a gear 20' rigidly mounted thereon. The transmission gear assembly 18 further includes a gear 19', rigidly mounted on a portion of the spindle 21 adjacent the overhanging wall member 14' and held in constantly meshed relation to the gear 17 on the shaft 15, and a conical block 25 coaxially and rigidly mounted on the spindle 21 between the gears 19' and 20'. The slot 14b extends in a direction perpendicular to the longitudinal axis of the channel selection shaft 13 and the spindle 21 is guided by the slot 14b to pivot between engaged and disengaged positions. However, the spindle 21 is normally biased to the disengaged position by the action of a wire spring 26, mounted over the spindle 21 and in contact therewith, and the gears 17 and 19' are so designed that no disengagement takes place even if the plane of either one of the gears 17 and 19' deviates from the plane of the other of the gears 17 and 19'.

With the tuner shown in FIG. 2 constructed as hereinabove described, an axial push of the shaft 15 towards the retracted position against the force of the spring element 16 causes the spindle 21 to pivot towards the engaged position due to the outer peripheral edge of the boss 15'a on the shaft 15 being slidingly engaged with the tapering surface of the conical block 25 on the spindle 21. Upon completion of the movement of the shaft 15 to the retracted position, the spindle 21 is pivoted to the engaged position with the gear 20' operatively engaged with the gear 12a and, therefore, subsequent rotation of the shaft 15 while the latter is still held in the retracted position is transmitted to the fine tuning member 12 in a substantially similar manner as hereinbefore described with reference to FIG. 1.

In the prior art tuner of the construction shown in FIG. 1 and described above, in order for the transmission gear assembly 18 to be supported by the support member 22, at least one of the gears 19 or 20 must be a member separate from the spindle 21. In other words, both of the gears 19 and 20 cannot be integrally formed with the spindle 21 and, therefore, when the gear 19 or 20 which is separate from the spindle 21 is to be rigidly connected to the spindle 21 after the latter has been inserted through the support plate 23, a time-consuming and costly connecting procedure, such as by the use of a welding or pressure-fitting technique, is required. In addition, because of the sliding engagement taking place between the sloped surface of the lateral projection 23a and the inner peripheral edge of the enlarged portion 15a of the fine tuning shaft 15 during the fine tuning operation, the durability of the tuner as a whole tends to be reduced.

With respect to the prior art tuner of the construction shown in FIG. 2, although the spindle 21, gears 19' and 20' and conical block 25 may be integrally formed with each other if the outer diameter of the gear 20' is made smaller than the width of the slot 14b in a manner substantially contrary to that shown in FIG. 2, a similar disadvantage as to the durability of the tuner as a whole still exists in the construction of FIG. 2 because of the sliding engagement between the outer peripheral edge of the boss 15'a and the tapering surface of the conical block 25.

SUMMARY OF THE INVENTION

Accordingly, the present invention has been made with a view to substantially eliminating the above described disadvantages inherent in the prior art tuners and is intended to provide an improved tuner which can readily be assembled without substantially requiring any complicated manufacturing procedure.

Another object of the present invention is to provide an improved tuner of the type referred to above, wherein gears and a spindle forming parts of the transmission gear assembly can be manufactured in an integral part thereby substantially eliminating the time-consuming and costly connecting procedure heretofore required.

A further object of the present invention is to provide an improved tuner of the type referred to above, wherein only one spring element is employed for biasing the fine tuning shaft 15 to the projected position and also for biasing the transmission gear assembly to bring the latter into a disengaged relation with respect to the fine tuning member.

Specifically, the present invention is directed to a tuner which comprises a support structure including a wall member, a main shaft rotatably extending through the wall member having one end accessible to an operator of the tuner, a turret drum having a plurality of coils, peripherally mounted thereon in equally spaced relation to each other and also to the longitudinal axis of said drum, and elongated fine tuning members one for each oscillation coil, each of said fine tuning members having a geared head and an elongated body adapted to be adjustably moved inside of the corresponding oscillation coil for fine tuning, said turret drum being mounted on the other end of the main shaft for rotation together therewith and supported in position for stepwise rotation through any one of a plurality of detent stop positions substantially equal in number to the number of the fine tuning members, an auxiliary hollow shaft coaxially mounted on the main shaft on one side of the wall member remote from the turret drum for rotation about and independently of the main shaft and also for axial sliding movement between projected and retracted position in a direction away from and close to the wall member, respectively, said auxiliary hollow shaft having a drive gear rigidly mounted thereon, transmission means including a spindle having on its opposed end portions integrally first and second gears in spaced relation to each other, said first and second gears being respectively engageable with the drive gear and any one of the geared heads for transmitting the rotational force of the auxiliary hollow shaft to one of the fine tuning members which has the geared head then engaged with the second gear, a first biasing means for biasing the auxiliary hollow shaft to the projected position, means including a substantially rectangular plate member for supporting the transmission means with a substantially intermediate portion of the spindle substantially non-axially displaceably extending through the plate member, said transmission means thus supported by said supporting means being movable between disengaged and engaged positions and operable in response to the movement of the auxiliary hollow shaft from the projected position towards the retracted position to move the transmission means from the disengaged position towards the engaged position, the rotational force of the auxiliary hollow shaft being transmitted to said one of the fine tuning member, only when the transmission means is moved to the engaged position and while the auxiliary hollow shaft is held in the retracted position, and a second biasing means for biasing the transmission means to the disengaged position.

According to one preferred embodiment of the present invention, the substantially rectangular plate member includes a flat body portion having a shaped opening completely extending through the thickness of the plate member, and a tongue portion positioned within the shaped opening, lying in the same plane as the body portion, and having at least a portion integral with the body portion, said tongue portion further having a bearing aperture extending completely through the thickness of the plate member and communicating with the shaped opening through at least one restricted passage defined in the tongue portion, the diameter of the bearing aperture being substantially equal to or slightly greater than the diameter of the intermediate portion of the spindle, the width of the restricted passage being sufficiently smaller than the diameter of the intermediate portion of the spindle as to cause the tongue portion to resiliently flex from the longitudinal axis of the spindle as the latter is received in the bearing aperture to support the spindle rotatably in the bearing aperture.

Since the tongue portion flexes away from the spindle as the latter is, during connection of the spindle to the plate member, passed through the restricted passage thereby enlarging the width of the restricted passage against the resiliency of the tongue portion, the spindle having the first and second gears integrally formed therewith can be employed. This means a substantial elimination of the time-consuming and costly connecting technique heretofore required as hereinbefore described.

According to another preferred embodiment of the present invention, the substantially rectangular plate member thus constructed is pivotally supported while the first gear on the spindle is constantly engaged with the drive gear on the main shaft. In addition, the first and second biasing means are a single means and are constituted by a leaf spring member applying a biasing force to the plate member to pivot the latter in a direction with the transmission means held in the disengaged position. The biasing force thus applied to the plate member is in turn transmitted through the plate member to the main shaft to urge the latter to the projected position. Therefore, no separate spring elements are needed.

BRIEF DESCRIPTION OF THE DRAWINGS

These and other objects and features of the present invention will become apparent from the following description taken in conjunction with preferred embodiments thereof with reference to the accompanying drawings, in which.

DETAILED DESCRIPTION OF THE INVENTION

Before the description of the present invention proceeds, it is to be noted that like parts are designated by like reference numerals throughout the accompanying drawings, including FIGS. 1 and 2, for the sake of brevity.

It is also to be noted that, since the present invention in one preferred embodiment is directed to an improvement in the construction of the tuner shown in FIG. 1, only the difference will now be described with reference to FIGS. 3 to 6.

Referring first to FIG. 4, the transmission gear assembly 18 comprises a spindle 30 having a first gear 31 coaxially mounted, or otherwise coaxially integrally formed, on one end and engageable with the drive gear 17 (FIG. 1) and having an outer diameter greater than the diameter of the spindle 30, and the other end of spindle 30 is splined to provide, or otherwise has integrally formed thereon, a second gear 32 engageable with the geared head 12a and having an outer diameter substantially equal to or smaller than the diameter of the spindle 30. A portion of the spindle 30 adjacent the second gear 32 has a stop ring 33 integrally formed thereon with a substantially conical shape tapering at 33a towards the second gear 32 and spaced a from the first gear 31. The distance between the first gear 31 and the stop ring 33 is so selected as to accommodate the thickness of the substantially rectangular plate 23 in the space defined therebetween. The stop ring 33 has a maximum diameter greater than the diameter of the spindle 30 and is selected as will be described later.

It is to be noted that the transmission gear assembly 18 having the construction described above and shown in FIG. 4 has a one-piece construction and is preferably made of a hard synthetic resin.

Referring now to FIG. 3, the substantially rectangular flat plate 23 includes a body portion 34 having a shaped opening shown as being in the form of a substantially circular opening 35 completely extending through the thickness of the plate 23, and a tongue portion connected integrally with the body portion 34 by a tang 36 and positioned within the circular opening 35. The tongue portion shown in FIG. 3 has a bearing hole 37 extending completely through the thickness of the plate 23 for the support of the spindle 30 in a manner as will be described later. The bearing hole 37 communicates with the circular opening 35 through a restricted passage 38 having a width smaller than the diameter of the spindle 30. It is, however, to be noted that the diameter of the bearing hole 37 is substantially equal to or slightly greater than the diameter of the spindle 30.

Because of the provision of the bearing hole 37, the tongue portion positioned within the circular opening 35 is so shaped as to define a pair of opposed clip fingers 39a and 39b extending from the tang 36 in an inwardly curved manner with respect to each other and terminating at a position opposed to the tang 36 to define the restricted passage 38. Each of the clip fingers 39a and 39b is curved to cause the bearing hole 37 to assume a substantially circular shape similar to the cross sectional shape of the spindle 30.

Preferably, the support plate 23 is made of a synthetic resin by the use of any known plastic molding technique so that, when the support plate 23 is constructed as shown in FIG. 3, the clip fingers 39a and 39b have their own resiliency with which, when the fingers 39a and 39b are substantially radially outwardly expanded when the restricted passage 38 is enlarged, they tend to return to the original shape as shown in FIG. 3. It is, however, to be noted that, depending upon the type of material used for the support plate 23 and/or the extent to which the fingers 39a and 39b are outwardly expanded, there is the possibility that one of the fingers 39a and 39b will be broken. This possibility can substantially be avoided by providing an adjustment groove 40 extending inwardly of the tang 36 for the purpose of adjusting of the freedom of each of the fingers 39a and 39b to flex about the tang 36.

It is also to be noted that the smallest possible diameter of the circular opening 35 should be slightly greater than the maximum diameter of the stop ring 33 on the spindle 30 plus the sum of the widths of the individual clip fingers 39a and 39b the reason for which will become clear from the subsequent description.

With the transmission gear assembly 18 and the support plate 23 being designed as described above and shown in FIGS. 4 and 3, respectively, mounting of the transmission gear assembly 18 on the support plate 23 can readily be carried out merely by inserting the spindle 30 into the bearing hole 37 with the second gear 32 aligned with the bearing hole 37. In particular, after the second gear 32 has been inserted through the bearing hole 37 and as the stop ring 33 passes through the bearing hole 37 during the continued application of an external pushing force to the spindle 30, the clip fingers 39a and 39b slide over the tapering surface 33a of the stop ring 33 and are substantially radially outwardly expanded within the circular opening 35 so that the restricted passage 38 is enlarged.

Upon completion of the passage of the stop ring 33 through the bearing hole 37, the clip fingers 39a and 39b, which have been outwardly expanded as hereinabove described, quickly return to the original position due to their own resiliency, falling into the space around the spindle and between the first gear 31 and the stop ring 33 and finally encircling the spindle 30 in an axially and laterally non-displaceable manner.

In the event that the transmission gear assembly 18 is mounted in the wrong position relative to the support plate 23, removal of the transmission gear assembly 18 from the support plate 23 may be necessary, which can also readily be carried out. Specifically, if the spindle 30 supported in the bearing hole 37 is forced into the restricted passage 38 to cause the clip fingers 39a and 39b to expand outwardly and then the spindle pulled, outwardly in a direction away from the second gear 32, this removal can be achieved.

The support plate 23 having the construction shown in FIG. 3 may have a slot, designated by 41 and shown by the dotted lines in FIG. 3, having a width substantially equal to the diameter of the spindle 30. Where this slot 41 is employed, it should extend from one edge of the support plate 34 into the circular opening 35 so that the mounting of the transmission gear assembly 18 shown in FIG. 4 can be carried out by first aligning that portion of the spindle 30 between the first gear 31 and the stop ring 33 with one open end of the slot 41 at said one edge of the support plate 23 and then pushing the spindle in a direction towards the bearing hole 37 and perpendicular to the longitudinal axis of said spindle 30.

Figure 5:
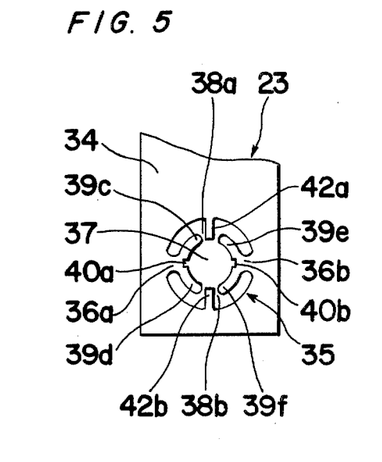
FIGS. 5 and 6 are views similar to FIG. 3, showing different modifications of the plate member.

In a modification shown in FIG. 5, the tongue portion positioned within the circular opening 35 is shown as being connected with the body portion 34 by a pair of opposed tangs 36a and 36b. The bearing hole 37 defined in the tongue portion is communicated with the circular opening 35 through a pair of opposed restricted passages 38a and 38b. The tongue portion is so shaped as to define two opposed pairs of clip fingers 39c, 39d and 39e and 39f, respectively, extending from the tangs 36a and 36b and spaced from each other to define the restricted passages 38a and 38b. Adjustment grooves 40a and 40b, corresponding in function to the adjustment groove 40 in the support plate 23 of the construction shown in FIG. 3, are also provided in the respective tangs 36a and 36b.

The mounting and removal of the transmission gear assembly 18 having the construction shown in FIG. 4 relative to the support plate 23 having the construction shown in FIG. 5 can be carried out in a manner similar to that for the support plate 23 having the construction shown in FIG. 3.

However, the greater the number of restricted passages 38a and 38b, the greater the possibility that the spindle 30 supported in the bearing hole 37 tends to jolt during its rotation. For the purpose of substantially eliminating this possibility, there is provided a pair of opposed elongated retainers 42a and 42b respectively extending radially inwardly of the circular opening 35 into the restricted passages 38a and 38b and terminating in alignment with the contour of the circle defined by the bearing hole 37.

Figure 6:
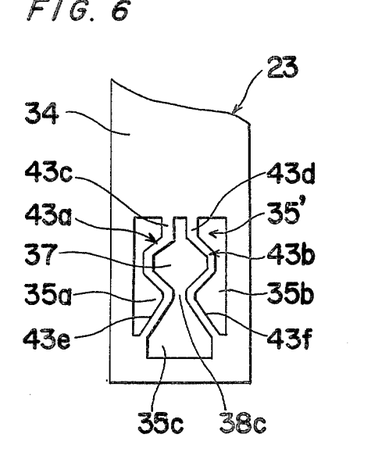

Referring now to FIG. 6, there is illustrated a further modification of the support plate 23. In the modification shown in FIG. 6, the shaped opening defined in the body portion 34 is shown as being in the form of a substantially rectangular opening 35' and the tongue portion is constituted by a pair of opposed strips 43a and 43b extending lengthwise of the rectangular opening 35' in spaced relation to each other. Each of these strips 43a and 43b has the opposite ends 43c or 43d and 43e or 43f serving as respective tangs through which the tongue portion is integrally connected with the body portion 34 of the support plate 23, the ends 43e and 43f of the strips 43a and 43b being outwardly diverged. Substantially intermediate portions of the respective strips 43a and 43b are outwardly curved to define the bearing hole 37 therebetween for the support of the spindle 30. With the strips 43a and 43b so shaped, the rectangular opening 35' is, as clearly shown in FIG. 6, divided into three segments 35a, 35b and 35c, the segments 35a and 35b having their respective shapes similar to each other and being positioned on opposite sides of the bearing hole 37. On the other hand, the bearing hole 37 is communicated with the remaining segment 35c through a restricted passage 38c defined between the closest portions of the ends 43c and 43f of the strips 43a and 43b.

The segment 35c having the rectangular opening 35' is so sized as to accommodate the maximum diameter of the stop ring 33. Alternatively, it may have a size sufficient to allow the transmission gear assembly 18 to freely pass therethrough.

The mounting of the transmission gear assembly 18 of the construction shown in FIG. 4 can be carried out by first inserting the spindle 30 through the segment 35c of the rectangular opening 35' until the space between the first gear 31 and the stop ring 33 is brought into alignment with the restricted passage 38c and then laterally displacing the spindle 30 into the bearing hole 37 against the resiliency of each of the strips 43a and 43b. By following a procedure reverse to the mounting procedure described above, the transmission gear assembly supported by the support plate 23 can be removed therefrom.

In the modification shown in FIG. 6, it is clear that the segment 35c of the rectangular opening 35' may have a size which is insufficient to accommodate the maximum diameter of the stop ring 33, in which case the mounting of the transmission gear assembly 18 may be carried out in a manner substantially similar to that for the support plates constructed as shown in FIGS. 3 and 5. Moreover, the support plate 23 constructed in the manner as shown in FIG. 6 may have a slot similar in function to the slot 41 which has been described as employable in the construction of FIG. 1.

Figure 7:
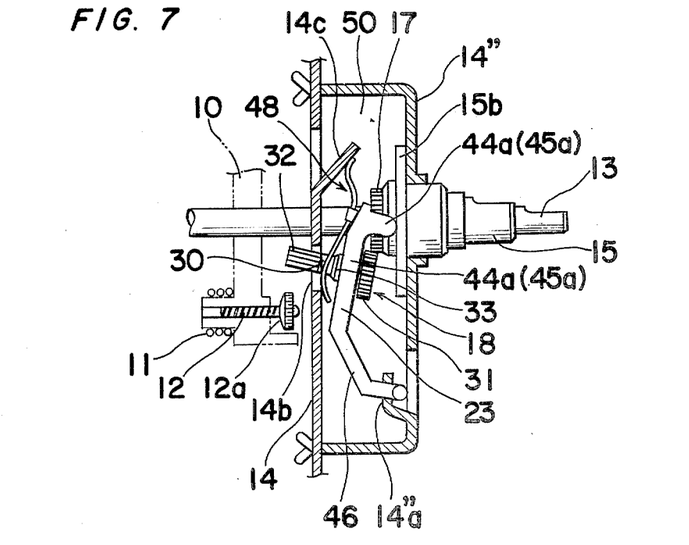
FIG. 7 is a longitudinal sectional view of a tuner according to another preferred embodiment of the present invention, shown in one operative position.
Figure 8:
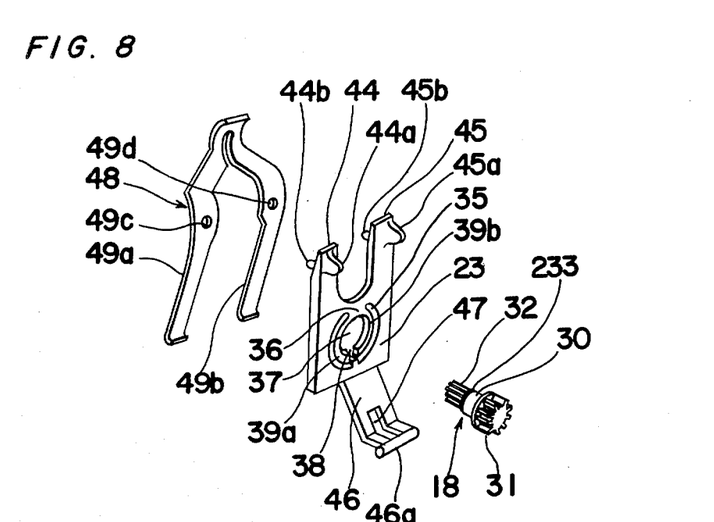
FIG. 8 is an exploded view of the plate member and its associated parts employed in the tuner having the construction shown in FIG. 7.
Figure 9:
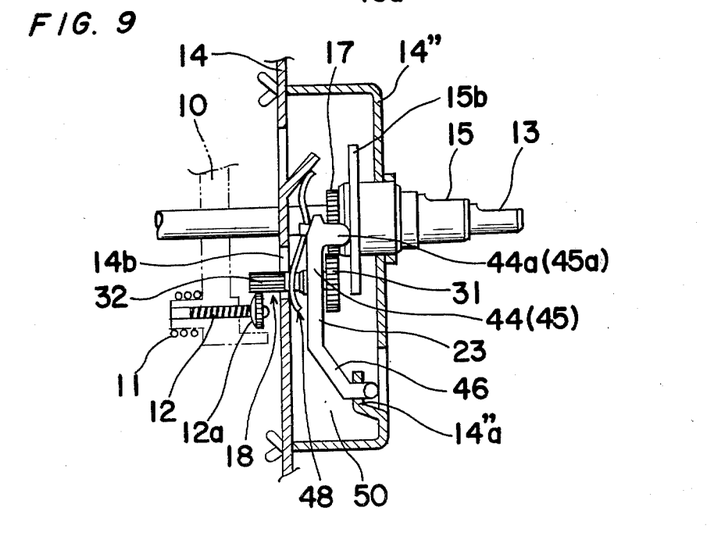
FIG. 9 is a view similar to FIG. 8, showing the tuner in a different operative position.

Referring now to FIGS. 7 to 9, there is shown another preferred embodiment of the present invention which is directed to an improvement in the construction shown in FIG. 2. In particular, in the construction which will now be described with reference to FIGS. 7 to 9, the employment of the two separate spring elements such as designated by 16 and 26 in FIG. 2 is eliminated and, instead thereof, a support plate 23 having the construction shown in FIG. 3 together with the transmission gear assembly having the construction shown in FIG. 4 is employed in combination with a leaf spring member as will become clear from the subsequent description.

Referring to FIGS. 7 to 9, the fine tuning shaft 15 is shown to have one end accessible to an operator of the tuner and positioned on one side of a channel-section wall member 14" remote from the turret drum 10 and the other end having the integral drive gear 17 positioned on the other side of the channel-section wall member 14" and within a space 50 defined between the wall members 14 and 14". This fine tuning shaft 15 rotatably extends through the wall member 14" and has an integral radially outwardly extending flange 15b on a substantially intermediate portion thereof adjacent the drive gear 17, said flange 15 being positioned within the space 50 and slidingly engaged with the wall member 14" in a manner which will be described later so that there is no possibility of any axial separation of the shaft 15 from the shaft 13. It is to be noted that, instead of the channel-section wall member 14", a bracket similar in shape to the overhanging wall member 14' but upside down from the position shown in FIG. 2 may be employed, in which case a circlip, washer or any other suitable stop member for defining the projected position of the tuning shaft 15 must be mounted in any suitable manner on the shaft 13.

The support plate 23 having the construction shown in FIg. 3 has on one end a pair of integral arms 44 and 45 spaced from each other a distance greater than the outer diameter of the drive gear 17. Each of these arms 44 and 45 has on the free end integral formed round-ended projection 44a or 45a and a carrier pin 44b or 45b extending in the opposite direction substantially perpendicularly to the plane of the support plate 23. The other end of the support plate 23 has an integral leg 46 extending therefrom at a certain angle relative to the plane of the support plate 23 and terminating in a rounded end 46a. The leg 46 has a slot 47 therein at a portion adjacent the rounded end 46a, the function of the slot 47 being described later.

The support plate assembly, which is constituted by the support plate 23, the arms 44 and 45 and the leg 46, is, after the transmission gear assembly 18 has been mounted on the plate 23 with the spindle 30 rotatably supported in the bearing hole 37 in the manner as hereinbefore described with reference to FIG. 3, positioned within the space 50 and pivotally supported in position with the slot 47 having a hanger 14"a therethrough, said hanger 14"a being an integral part of the wall member 14". It is, however, to be noted that the hanger 14"a may be a part separate from the wall member 14" and, in this case, may be rigidly secured to the wall member 14" so as to be positioned within the space 50.

When the support plate assembly is so positioned within the space 50, the round-ended projections 44a and 45a and the carrier pins 44b and 45b should be oriented towards the flange 15b on the tuning shaft 15 and the wall member 14 on one hand and the support plate assembly thus supported is pivotable between disengaged and engaged positions about the pivotal connection between the leg 46 and the hanger 14"a. In addition, the tuner of the construction thus far described should be designed such that, when the support plate assembly is positioned within the space 50 and so long as the same is pivoted to the disengaged position as shown in FIG. 7, the drive gear 17 and the first gear 31 of the transmission gear assembly 18 are held in constantly meshed relation to each other while the second gear 32 of the transmission gear assembly 18, which protrudes through the slot 14b, is disengaged from the corresponding geared head 12a of the fine tuning member 12.

For biasing the tuning shaft 15 to the projected position and concurrently biasing the transmission gear assembly to the disengaged position, a leaf spring member 48 is employed. This leaf spring member 48 as illustrated is in the form of a substantially U-shaped member having a pair of curved resilient legs 49a and 49b spaced from each other a distance corresponding to the space between the arms 44 and 45. These resilient legs 49a and 49b have bearing perforations 49c and 49d respectively therein for receiving the carrier pins 44b and 45b therethrough.

As best shown in FIG. 7, the leaf spring member 48 is held in position within the space 50 straddling the channel selection shaft 13 and having the free ends and bent portion slidingly engaged with the wall member 14 and having carrier pins 44b and 45b projecting into the bearing perforations 49c and 49d in the respective legs 49a and 49b. Because of the carrier pins 44b and 45b project through the bearing perforations 49c and 49d, there is no possibility of any arbitrary or accidental separation or displacement of the leaf spring member 48 from the support plate assembly when and after the tuner has been assembled in the manner shown in FIG. 7.

Preferably, that portion of the wall member 14 with which the bent portion of the leaf spring member 48, corresponding to the bottom of the shape of a figure "U", slidingly engages projects as at 14c into the space 50 at a certain angle relative to the plane of the wall to provide a seat for the bent portion of the leaf spring member 48. If the seat 14c is employed as shown in FIGS. 7 and 9, the resiliency of the leaf spring member 48 is applied in part through the support plate assembly to the flange 15b on the tuning shaft 15 to bias the latter to the projected position and in part to the support plate assembly to bias the latter downwards so that the leg 46 is firmly and stably received by the hanger 14"a.

With the leaf spring member 48 so positioned, the resiliency exerted by the leaf spring member 48 is transmitted to the support plate assembly and the roundended projections 44a and 45a are consequently engaged with the flange 15b on the tuning shaft 15. Therefore, the tuning shaft 15 is also biased to the projected position. Although at this time the longitudinal axis of the spindle 30 extends in non-parallel relation to the longitudinal axis of the fine tuning shaft 15 with the plane of rotation of the first gear 31 diverging from the plane of rotation of the drive gear 17, there is no possibility of any disengagement of the gears 17 and 31. This can be achieved by suitably selecting the design of the tooth arrangement on one or both of the gears 17 and 31 as is well known to those skilled in the art.

From the foregoing, it has now become clear that application of an external pushing force to the fine tuning shaft 15 after the turret drum 10 has been rotated to any one of the detent positions by the manipulation of the channel selection shaft 13 causes the shaft 15 to move from the projected position towards the retracted position against the resiliency of the leaf spring member 48 and, simultaneously therewith, to pivot the support plate assembly counterclockwise, as seen in FIG. 9, and in such a direction as to move the transmission gear assembly from the disengaged position towards the engaged position.

As shown in FIG. 9, when the support plate assembly is moved to the engaged position, the spindle 30 extends in substantially parallel relation to the longitudinal axis of the shaft 13 or 15 with the first and second gears 31 and 32 operatively engaged to the drive gear 17 and the geared head 12a of the corresponding tuning member 12.

Removal of the external pushing force, which has been applied to the shaft 15, results in return of the support plate assembly and the tuning shaft 15 to the respective original positions, by the action of the leaf spring member 48.

Although the present invention has fully been described in connection with the preferred embodiments thereof with reference to the accompanying drawings, it is to be noted that various changes and modifications will be apparent to those skilled in the art. By way of example, the leaf spring member 48 may be constituted by only one resilient leg 49a and 49b. In addition, irrespective of the design of the leaf spring member 48, the support plate 23 may have only one of the arms 44 or 45.

So far as the support plate 23 is concerned, it may be constructed as shown in any one of FIGS. 5 and 6 other than that shown in FIG. 3.

With respect to the leaf spring member 48, a single tension or compression spring may be employed in place of the leaf spring member 48. Moreover, in place of the leaf spring member 48, a wire spring or a coil spring may also be employed.

Furthermore, each of the carrier pins 44b and 45b may have a length sufficient to allow its tip or free end to engage the wall member 14 simultaneously with the arrival of the transmission gear assembly at the engaged position, thereby preventing the axial pushing force applied to the tuning shaft 15 to be unnecessarily transmitted to the geared head 12a of the corresponding tuning member 12.

In view of the above, such changes and modifications are to be construed as included within the true scope of the present invention unless they depart therefrom.

What is claimed is:

1. A tuner for use in a telecommunication receiver which comprises, in combination:

a support structure including a wall member;

a main shaft rotatably extending through the wall member and having one end portion accessible to an operator of the tuner;

a rotary drum having a plurality of oscillation coils, peripherally mounted thereon in equally spaced relation to each other and also to the longitudinal axis of the drum, and elongated fine tuning members one for each oscillation coil, each of said fine tuning members having a geared head and an elongated body adapted to be adjustably moved inside of the corresponding oscillation coil for fine tuning, said drum being mounted on the other end portion of the main shaft for rotation together therewith and supported in position for stepwise rotation through any one of a plurality of detent stop positions substantially equal in number to the number of the fine tuning members;

an auxiliary hollow shaft coaxially mounted on the one end of the main shaft for rotation about and independently of the main shaft and also for axial sliding movement between projected and retracted position in a direction away from and close to the wall member, respectively, said auxiliary hollow shaft having a drive gear rigidly mounted thereon;

a first biasing means for biasing the auxiliary hollow shaft to the projected position;

transmission means including a spindle having first and second gears on opposite end portions thereof in spaced relation with each other, said first and second gears being respectively engageable with the drive gear and the respective geared heads for transmitting the rotational force of the auxiliary hollow shaft to one of the fine tuning members which has the geared head engaged with the second gear, said transmission means being movable between disconnected and connected positions and operable in response to the movement of the auxiliary hollow shaft from the projected position towards the retracted position to move from the disconnected position towards the connected position, the rotational force of the auxiliary hollow shaft being, when the transmission means is moved to the connected position and while the auxiliary hollow shaft is held in the retracted position against the first biasing means, transmitted to said one of the fine tuning members;

a second biasing means for biasing the transmission means to the disconnected position; and a support plate means for supporting the transmission means and constituted by a body portion having a shaped opening completely extending through the thickness of the support plate means, and a resilient means having a bearing aperture and being connected to said body portion and positioned within the shaped opening, the diameter of the bearing aperture being substantially equal to or slightly greater than the diameter of the spindle, the resilient means being resiliently movable to flex away from the longitudinal axis of the spindle as the spindle is urged into the bearing aperture to receive and support the spindle rotatably in the bearing aperture, said support plate means being movably mounted on said support structure for movement between the disconnected and connected positions of said transmission means.

2. A tuner as claimed in claim 1, wherein said body portion of said support plate means is a flat body portion and said resilient means is a tongue portion positioned within the shaped opening and having at least a portion integral with the body portion, said tongue portion having said bearing aperture extending completely through the thickness of the support plate means and having at least one restricted passage defined in the tongue portion communicating with said shaped opening, the width of the restricted passage being smaller than the diameter of the spindle for causing the tongue portion to resiliently flex away from the longitudinal axis of the spindle as the spindle is urged into the bearing aperture to support the spindle rotatably in the bearing aperture.

3. A tuner as claimed in claim 1, wherein said shaped opening is a substantially circular opening and said tongue portion is constituted by a pair of opposed clip fingers extending from said body portion in opposite directions and curved to follow the contour of the bearing aperture, said restricted passage being defined between the free ends of said clip fingers.

4. A tuner as claimed in claim 1, further comprising means for pivotally supporting the support plate means and wherein said first gear is engaged with the drive gear in both the disconnected and connected positions of said transmission means and said support plate means is further constituted by a pair of opposed arms extending from one end of said body portion in spaced relation to each other and a leg extending from the other end of said body portion, said body portion having the free end of said leg pivotally connected to said pivotal supporting means, said transmission means being in the disconnected position with the second gear disengaged from the geared head of the corresponding tuning member when said body portion is pivoted in one direction, and being in the connected position with the second gear engaged with the geared head of the corresponding tuning member when said body portion is pivoted in the other direction.

5. A tuner as claimed in claim 4, wherein said first and second biasing means are constituted by a single spring element and wherein the respective free ends of said arms are coupled to the auxiliary hollow shaft, said spring element applying its biasing force in part to said auxiliary hollow shaft through said free ends of said arms and being engaged with said support plate for applying its biasing force in part to said support plate means to pivot the latter in said one direction.

6. A tuner as claimed in claim 5, wherein said spring element is constituted by a leaf spring member.

7. A tuner as claimed in claim 6, wherein said arms have respective carrier pins protruding outwardly substantially perpendicularly to the associated arms, and said leaf spring member has a substantially U-shaped configuration having a pair of spaced leg portions having bearing perforations, said spring member being carried by said arms with said carrier pins respectively protruding through said bearing perforation and positioned substantially between the wall member and the body portion.

8. A tuner for use in a telecommunication receiver which comprises, in combination:
a support structure including a wall member;
a main shaft rotatably extending through the wall member and having one end portion accessible to an operator of the tuner;
a rotary drum having a plurality of oscillation coils peripherally mounted thereon in equally spaced relation to each other and also to the longitudinal axis of the drum, and elongated fine tuning members one for each oscillation coil, each of said fine tuning members having a geared head and an elongated body adapted to be adjustably moved inside of the corresponding oscillation coil for fine tuning, said drum being mounted on the other end portion of the main shaft for rotation together therewith and supported in position for stepwise rotation through any one of a plurality of detent stop positions substantially equal in number to the number of the fine tuning members;
an auxiliary hollow shaft coaxially mounted on the one end of the main shaft for rotation about and independently of the main shaft and also for axial sliding movement between projected and retracted positions in a direction away from and close to the wall member, respectively, said auxiliary hollow shaft having a drive gear rigidly mounted thereon;
a first biasing means for biasing the auxiliary hollow shaft to the projected position;
transmission means including a spindle, having first and second gears on opposite end portions thereof in spaced relation with each other, said first and second gears being respectively engageable with the drive gear and the respective geared heads for transmitting the rotational force of the auxiliary hollow shaft to one of the fine tuning members which has the geared head engaged with the second gear and a support plate means rotatably carrying said spindle with said first and second gears positioned on opposite sides of said support plate means, said support plate means being supported for movement between a disconnected position in which said second gear is disengaged from a geared head and a connected position in which said second gear is engaged with a gear head, and said support plate means being engaged by said auxiliary hollow shaft to move from the disconnected position to the connected position in response to the movement of the auxiliary hollow shaft from the projected position to the retracted position, whereby the rotational force of the auxiliary hollow shaft is, when the support plate means is moved to the connected position and the auxiliary hollow shaft is held in the retracted position against the first biasing means, transmitted to said one of the fine tuning members;
a second biasing means for biasing the support plate means to the disconnected position; and
means for supporting said support plate means, said supporting means including a support wall rigidly secured to the wall member of the support structure in spaced relation to said wall member, at least said drive gear on the auxiliary hollow shaft, said first gear on the spindle and said support plate means being accommodated within a space defined between said wall means and said support wall, said support plate means having a portion pivotally connected to said support wall for enabling said support plate means to pivot between said connected disconnected positions.

9. A tuner as claimed in claim 8, wherein said first and second biasing means are constituted by a single spring element, said spring element engaging said support plate means for applying a biasing force to said support plate means to urge the latter to the disconnected position, the support plate means in the disconnected position biasing the auxiliary hollow shaft to the projected position.

10. A tuner as claimed in claim 9, wherein said spring element is a generally U-shaped leaf spring having a pair of legs connected at one end with each other, said leaf spring being positioned within the space between the wall member and the support wall with the free ends and connected ends being engaged with the wall member and with substantially intermediate portions of said legs being engaged with a portion of the support plate means opposed to the portion of said support plate means which is pivotally connected to the support wall.

* * * * *